(12) United States Patent
Nam et al.

(10) Patent No.: US 8,536,969 B2
(45) Date of Patent: Sep. 17, 2013

(54) TRANSFORMER

(75) Inventors: Joong Jin Nam, Seoul (KR); Chul Hwan Yoon, Gyunggi-do (KR); Ki Joong Kim, Jeollabuk-do (KR); Ju Young Park, Gangwon-do (KR); Jun Goo Won, Gyunggi-do (KR); Youn Suk Kim, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 13/231,429

(22) Filed: Sep. 13, 2011

(65) Prior Publication Data

US 2012/0068803 A1 Mar. 22, 2012

(30) Foreign Application Priority Data

Sep. 16, 2010 (KR) .................. 10-2010-0091003

(51) Int. Cl.
*H01F 5/00* (2006.01)
*H01F 27/28* (2006.01)

(52) U.S. Cl.
USPC .......................... 336/200; 336/223; 336/232

(58) Field of Classification Search
USPC .......................... 336/200, 223, 232
See application file for complete search history.

(56) References Cited

U.S. PATENT DOCUMENTS

| | | |
|---|---|---|
| 2003/0001709 A1 | 1/2003 | Visser |
| 2009/0039977 A1 | 2/2009 | Lee et al. |
| 2009/0085705 A1 | 4/2009 | Kim et al. |
| 2009/0174515 A1 | 7/2009 | Lee et al. |
| 2010/0164667 A1* | 7/2010 | Ho-Hsiang ............. 336/137 |

FOREIGN PATENT DOCUMENTS

| | | |
|---|---|---|
| GB | 2 445 677 A | 7/2008 |
| KR | 10-2009-0014795 A | 2/2009 |
| KR | 10-2009-0076840 A | 7/2009 |
| KR | 10-2009-0129379 A | 12/2009 |
| WO | WO 2010/011264 A2 | 1/2010 |

OTHER PUBLICATIONS

Combined Search and Examination Report, issued in United Kingdom Patent Application No. GB1115876.3, dated Jan. 13, 2012.
Korean Office Action issued in Korean Patent Application No. 9-5-2011-060772325 dated Oct. 21, 2011.

* cited by examiner

*Primary Examiner* — Mohamad Musleh
*Assistant Examiner* — Ronald Hinson
(74) *Attorney, Agent, or Firm* — McDermott Will & Emery LLP

(57) ABSTRACT

A transformer having a structure in which first and second substrates are vertically laminated, including: a plurality of input conductive lines disposed on the first substrate along a circumference thereof; a single output conductive line disposed co-planarly with the plurality of input conductive lines, and having one end connected to a ground; and an air bridge including a pair of conductive via holes formed in any one conductive line in an overlapped area in which the input and output conductive lines are intersected with each other to penetrate through the first substrate and a single piece of conductive line connecting the pair of conductive via holes to each other and disposed on the second substrate, thereby preventing a short-circuit between the input and output conductive lines.

1 Claim, 2 Drawing Sheets

TRANSFORMER

CROSS-REFERENCE TO RELATED APPLICATIONS

This application claims the priority of Korean Patent Application No. 10-2010-0091003 filed on Sep. 16, 2010, in the Korean Intellectual Property Office, the disclosure of which is incorporated herein by reference.

BACKGROUND OF THE INVENTION

1. Field of the Invention

The present invention relates to a transformer, and more particularly, to a transformer, a design of which is simplified by forming a plurality of overlapped areas in which at least three conductive lines are overlapped and allowing only two conductive lines to be overlapped in each overlapped area.

2. Description of the Related Art

A power amplifier for amplifying a power of a transmission signal is generally used at a transmission end of a mobile communications terminal such as a cellular phone, or the like. This power amplifier is required to amplify the transmission signal to an appropriate level of power. This power amplifier generally performs matching and power combining by using a transformer having two or more pairs of input conductive lines and an output conductive line. However, as the number of conductive lines of the transformer increases, there are areas in which the conductive lines are overlapped with each other. This increase in input and output terminals may cause short-circuits between the conductive lines. Therefore, in order to solve these defects, at least three substrates are laminated and used.

However, in the related art, in the case of the transformer in which at least three substrates are laminated, since the design of the transformer is complicated and the manufacturing process thereof may be time consuming, a competitive price may be difficult to achieve and costs may increase.

SUMMARY OF THE INVENTION

An aspect of the present invention provides a transformer having a simplified design and a reduced manufacturing period.

According to an aspect of the present invention, there is provided a transformer having a structure in which first and second substrates are vertically laminated, the transformer including: a plurality of input conductive lines disposed on the first substrate along a circumference thereof and each having both ends provided as input terminals of positive (+) and negative (−) signals, respectively; a single output conductive line disposed co-planarly with the plurality of input conductive lines, formed in a vicinity of at least one of the plurality of input conductive lines to thereby be electromagnetically coupled to the at least one input conductive line, and having one end connected to a ground; and an air bridge including a pair of conductive via holes formed in any one conductive line in an overlapped area in which the input and output conductive lines are intersected with each other to penetrate through the first substrate and a single piece of conductive line connecting the pair of conductive via holes to each other and disposed on the second substrate, thereby preventing a short-circuit between the input and output conductive lines.

The overlapped area may be provided in plural to thereby allow only two conductive lines to be overlapped with each other in each overlapped area.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Embodiments of the present invention will now be described in detail with reference to the accompanying drawings.

Figure 1:
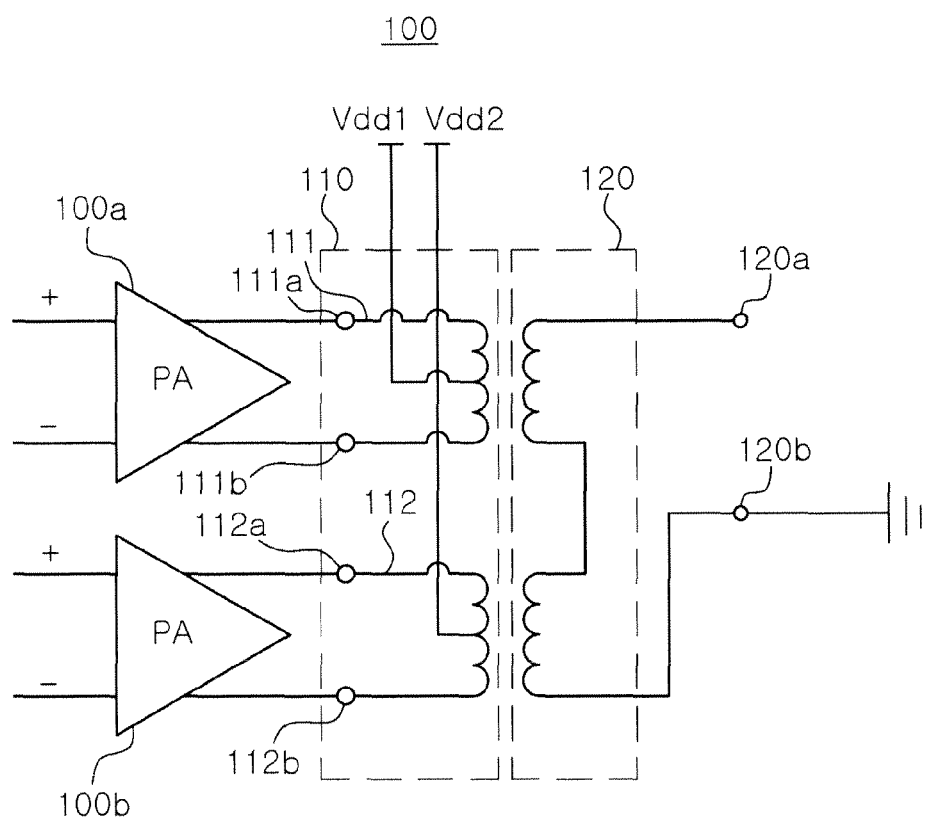
FIG. 1 is a circuit diagram of a transformer according to an embodiment of the present invention.

FIG. 1 is a circuit diagram of a transformer according to an embodiment of the present invention.

Referring to FIG. 1, a transformer 100 according to the embodiment of the present invention may include an input conductive line 110 and an output conductive line 120. In addition, the input conductive line 110 may include a first input conductive line 111 connected to first input ports 111a and 111b and a second input conductive line 112 connected to second input ports 112a and 112b, and the output conductive line 120 may be connected to output ports 120a and 120b.

The input conductive line 110 may include a plurality of the input conductive lines of which both ends thereof are provided as input terminals of positive (+) and negative (−) signals, respectively. In the embodiment of the present invention, the input conductive line 110 may include the two input conductive lines 111 and 112. Both ends of each of the two input conductive lines 111 and 112 may be connected to power amplifiers (PAs) 100a and 100b. A current may be supplied from the power amplifiers (PAs) 100a and 100b to the input conductive lines 111 and 112 through the input ports 111a, 111b, 112a, and 112b, and a magnetically induced current may be generated in the output conductive line 120. In addition, powers Vdd1 and Vdd2 may be supplied to the respective input conductive lines 111 and 112. In the transformer according to the embodiment of the present invention, an input conductive line may be connected to a power amplifier implemented as a complementary metal oxide semiconductor (CMOS) type PA used in a mobile communications terminal.

The output conductive line 120 may be formed in the vicinity of each of the input conductive lines 111 and 112 to thereby be electromagnetically coupled to the plurality of input conductive lines 111 and 112, and may have one end connected to a ground (GND) through the output port 120b. A magnetically induced current may be generated in the output conductive line 120 by the current supplied to the input conductive lines 111 and 112.

Figure 2:
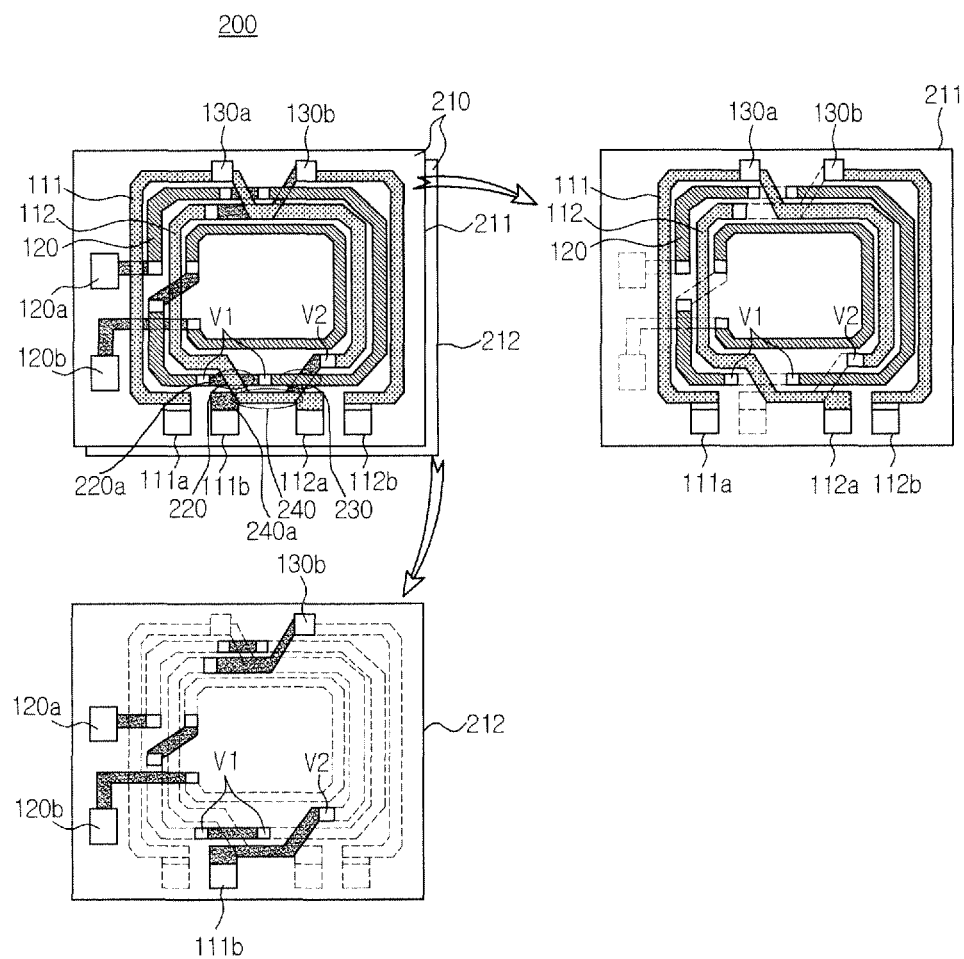
FIG. 2 is a plan view of a transformer according to an embodiment of the present invention.

FIG. 2 is a plan view of a transformer according to an embodiment of the present invention.

Referring to FIGS. 1 and 2, a transformer 200 according to the embodiment of the present invention may include a laminated substrate 210, the input conductive lines 111 and 112 connected to the input ports 111a, 111b, 112a, and 112b, and the output conductive line 120 connected to the output ports 120a and 120b.

The laminated substrate 210 may be a dielectric substrate having a plurality of layers. The embodiment of the present invention exemplarily illustrates two vertically laminated substrates. As shown in FIG. 2, the input conductive lines 111 and 112 and the output conductive line 120 are disposed in a circumferential direction of a first substrate co-planarly with the first substrate, and an air bridge may be provided in order to prevent a short circuit between the input conductive lines 111 and 112 and the output conductive line 120 due to the direct contact therebetween. The air bridge will be described below. As the laminated substrate, a high frequency substrate may be used.

Meanwhile, the input conductive lines 111 and 112 may be formed on the first substrate and have both ends thereof provided as input terminals of positive (+) and negative (−) signals, respectively. The plurality of input conductive lines may be formed on an upper surface of the first substrate. In the embodiment of the present invention, the input conductive line 110 may include the two input conductive lines 111 and 112. Both ends of each of the two input conductive lines 111 and 112 may be connected to the power amplifiers (PAs) 100a and 100b. In the transformer according to the embodiment of the present invention, an input conducive line may be connected to a power amplifier implemented as a CMOS type PA used in a mobile communications terminal.

The output conductive line 120 may be formed in the vicinity of each of the input conductive lines 111 and 112 to thereby be electromagnetically coupled to the input conductive lines 111 and 112, and may have one end 221 connected to a ground (GND) through the output port 120b.

In the embodiment of the present invention, two input conductive lines 111 and 112 may respectively form a loop around the same one area on the first substrate, and the output conductive line 120 may also form a loop on the first substrate, which is on the same plane as a plane on which the input conductive lines 111 and 112 are formed. In addition, the output conductive line 120 may be disposed between two input conductive lines 111 and 112 so as to be electromagnetically coupled to each of two input conductive lines 111 and 112.

Further, in the embodiment of the present invention, pads 130a and 130b for supplying a power may be formed in an area of two input conductive lines 111 and 112, respectively. Each of the pads 130a and 130b for supplying a power may be provided as a terminal for supplying a power to each of the input conductive lines 111 and 112. The pads 130a and 130b for supplying a power may be formed at positions of the respective input conductive lines 111 and 112, at which an electrical RF swing potential is 0 V. Since there is no direct current (DC) ground in a CMOS power amplifier, an alternate current (AC) ground is used. The RF swing potential of 0 V means the AC ground.

Meanwhile, according to an embodiment of the present invention, in order to prevent three conductive lines 111, 112, and 120 from being overlapped with each other in a single overlapped area, a plurality of overlapped areas 220, 230, and 240 are formed, and only two conductive lines are overlapped with each other in each overlapped area. Hereinafter, an embodiment of the present invention will be described in more detail in relation with the air bridge.

Referring to FIG. 2, in the case of the transformer according to the embodiment of the present invention, the two input conductive lines 111 and 112 and the single output conductive line 120 are disposed on the first substrate along a circumference of the first substrate. In this case, a plurality of overlapped areas including a first overlapped area 220 in which the second input conductive line 112 and the output conductive line 120 are intersected with each other, a second overlapped area 230 in which the first input conductive line 111 and the output conductive line 120 are intersected with each other, and a third overlapped area 240 in which the second input conductive line 112 and the first input conductive line 111 are intersected with each other are formed, and only two conductive lines are overlapped with each other in each overlapped area.

In the first overlapped area 220, the second input conductive line 112 and the output conductive line 120 are intersected with each other. In this case, a portion of the output conductive line 120 disposed on the first substrate is cut, and a pair of conductive via holes V1 penetrating through the first substrate may be formed at both ends of the cut output conductive line 120. In addition, a single piece of conductive line 220a is disposed on a second substrate positioned under the first substrate to thereby connect the pair of conductive via holes V1 to each other. The above-mentioned structure is called an "air bridge". In the case of the first overlapped area 220, the air bridge is formed in the output conductive line 120.

Likewise, the second overlapped area 230 is an area in which the first input conductive line 111 and the output conductive line 120 are intersected with each other, and a single piece of conductive line 240a may connect conductive via holes V2 to each other (the conductive via holes may be formed in the input ports 111a, 111b, 112a, and 112b).

In addition, the third overlapped area 240 is an area in which the second input conductive line 112 and the first input conductive line 111 are intersected with each other, and a single piece of conductive line 240a is configured to connect conductive via holes V2 to each other (the conductive via holes may be formed in the input ports 111a, 111b, 112a, and 112b).

Through the above-mentioned structure, the transformer having the plurality of input and output conductive lines is disposed on two vertically laminated substrates, whereby a design of the transformer may be simplified and a process period therefor may also be reduced. Therefore, a competitive product price may be secured, and manufacturing costs may be reduced.

In addition, although a conductive line in which the air bridge is formed, among the plurality of input and output conductive lines, is not described in FIG. 2, the air bridge may be formed in the output conductive line in the area in which the output conductive line and the input conductive line are overlapped with each other and be formed in the first input conductive line in the area in which the input conductive lines are overlapped with each other. The conductive line in which the air bridge is formed is previously determined as described above, whereby a design of the transformer may be further simplified.

As set forth above, according to the embodiment of the present invention, the plurality of overlapped areas in which at least three conductive lines are overlapped with each other are formed and only two conductive lines are overlapped with each other in each overlapped area, whereby a design of the transformer may be simplified, and a process period therefor may also be reduced. Therefore, a competitive price may be secured, and a cost may be reduced.

While the present invention has been shown and described in connection with the exemplary embodiments, it will be apparent to those skilled in the art that modifications and variations can be made without departing from the spirit and scope of the invention as defined by the appended claims.

What is claimed is:

1. A transformer having a structure in which first and second substrates are vertically laminated, the transformer comprising: a plurality of input conductive lines disposed on the first substrate along a circumference thereof and each input conductive line having both ends provided as input terminals of positive (+) and negative (−) signals, respectively; a single output conductive line disposed co-planarly with the plurality of input conductive lines, formed in a vicinity of at least one of the plurality of input conductive lines to be electromagnetically coupled to the at least one input conductive line, and having one end of the single output conductive line connected to a ground; an air bridge including a pair of conductive via holes formed in any one conductive line in an overlapped area in which the input and output conductive lines are intersected with each other to penetrate through the first substrate and a single piece of conductive line connecting the pair of conductive via holes to each other and disposed on the second substrate, thereby preventing a short-circuit between the input and output conductive lines; and a plurality of overlapped areas disposed in such a manner as to allow only two conductive lines to be overlapped with each other in respective overlapped areas, wherein in each overlapped area an input conductive line is overlapped with no more than one conductive line.

* * * * *